US008815667B2

(12) United States Patent
Smith et al.

(10) Patent No.: US 8,815,667 B2
(45) Date of Patent: Aug. 26, 2014

(54) TRANSISTORS WITH AN EXTENSION REGION HAVING STRIPS OF DIFFERING CONDUCTIVITY TYPE AND METHODS OF FORMING THE SAME

(75) Inventors: Michael Smith, Boise, ID (US); Vladimir Mikhalev, Boise, ID (US); Puneet Sharma, Boise, ID (US); Zia Alan Shafi, Boise, ID (US); Henry Jim Fulford, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 820 days.

(21) Appl. No.: 12/639,158

(22) Filed: Dec. 16, 2009

(65) Prior Publication Data

US 2011/0140204 A1    Jun. 16, 2011

(51) Int. Cl.
*H01L 21/338* (2006.01)
(52) U.S. Cl.
USPC ..... 438/185; 438/307; 257/408; 257/E29.266

(58) Field of Classification Search
USPC ......... 438/184, 185, 305, 306, 307, 301, 303, 438/231, 291; 257/344, 408, E27.06, 257/E21.633, E29.266
See application file for complete search history.

(56) References Cited

U.S. PATENT DOCUMENTS 5,929,469 A * 7/1999 Mimoto et al. ............... 257/208
6,455,386 B1 * 9/2002 Mirabel ........................ 438/301
6,605,843 B1 * 8/2003 Krivokapic et al. .......... 257/347

* cited by examiner

*Primary Examiner* — David Vu
(74) *Attorney, Agent, or Firm* — Dicke, Billig & Czaja, PLLC

(57) ABSTRACT

Methods of forming transistors and transistors are disclosed, such as a transistor having a gate dielectric over a semiconductor having a first conductivity type, a control gate over the gate dielectric, source and drain regions having a second conductivity type in the semiconductor having the first conductivity type, and strips having the second conductivity type within the semiconductor having the first conductivity type and interposed between the control gate and at least one of the source and drain regions.

23 Claims, 6 Drawing Sheets

TRANSISTORS WITH AN EXTENSION REGION HAVING STRIPS OF DIFFERING CONDUCTIVITY TYPE AND METHODS OF FORMING THE SAME

FIELD

The present disclosure relates generally to transistors and in particular the present disclosure relates to transistors with an extension region having strips of differing conductivity type and methods of forming the same.

BACKGROUND

Transistors, such as field effect transistors (FETs), having high breakdown voltages (e.g., above about 15 to about 80 volts or greater) are used in various applications, such as power management or amplification and for driver systems. For example, the breakdown voltage may be defined as the voltage at which the drain (or source) breaks down while the transistor is turned off. In addition, transistors having high breakdown voltages may be used on the periphery of a memory device. For example, these transistors can be located between charge pumps and the string drivers of a memory device that provide voltages to the access lines (e.g., word lines) and can be used in charge pump circuitry and for the string drivers.

One technique for creating transistors with high breakdown voltages uses a lightly doped region between the drain and control gate of the transistor. This region is sometimes referred to as a drain extension region. Devices that use this technique are sometimes referred to as Reduced Surface Field (RESURF) devices.

Figure 1:
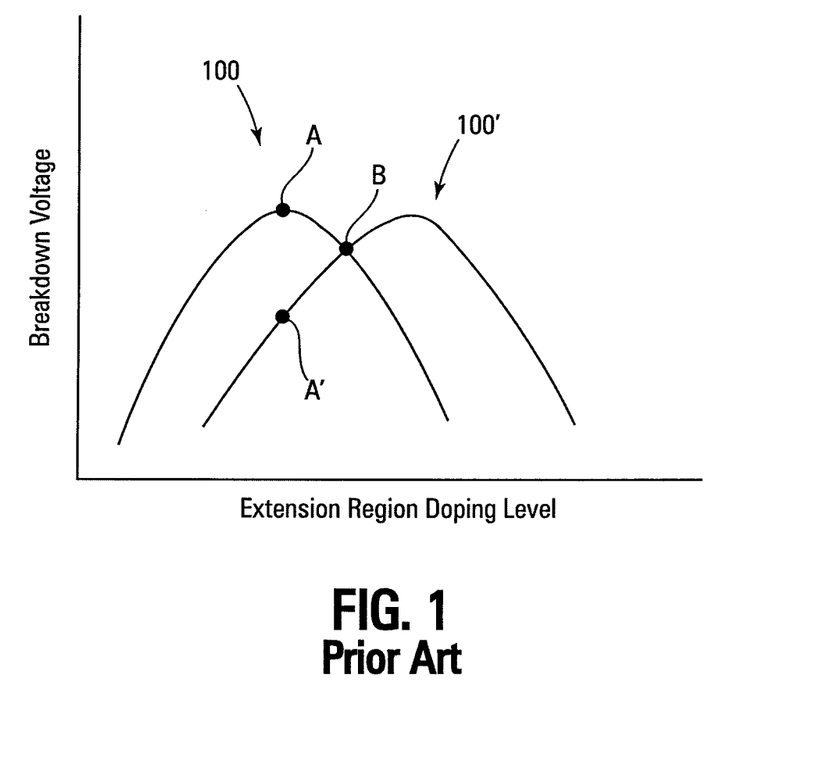
FIG. 1 illustrates breakdown-voltage versus drain-extension-region-doping-level curves of theoretical prior art devices.

Transistors with high breakdown voltages sometimes have different breakdown-voltage versus drain-extension-region-doping-level curves (e.g., doping curves), as shown in FIG. 1. For example, doping curve 100 may be for one transistor and the doping curve 100' may be for another transistor.

It is sometimes desirable to dope the transistors concurrently in a single doping step during fabrication in that multiple doping steps add process steps and thus fabrication costs. The problem with this is that the doping may correspond to the peak breakdown voltage for one transistor (e.g., as indicated by point A), whereas that doping may correspond a relatively low breakdown voltage for the other transistor (e.g., as indicated by point A'). For example, the breakdown voltage at point A' may be too low for the intended application. Therefore, the doping is sometimes adjusted to compromise so that all of the transistors have breakdown voltages that are sufficient for their intended applications.

For example, the doping may be adjusted to correspond to the point B, where doping curves 100 and 100' cross and where the breakdown voltage is sufficient for the applications intended for the respective transistors. Note that point B corresponds to over doping (e.g., the doping exceeds that which produces the maximum breakdown voltage) the transistor with doping curve 100 and under doping (e.g., the doping is below that which produces the maximum breakdown voltage) the transistor with doping curve 100'.

For the reasons stated above, and for other reasons stated below which will become apparent to those skilled in the art upon reading and understanding the present specification, there is a need in the art for alternative transistor structures and methods of their formation.

DETAILED DESCRIPTION

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The following detailed description is, therefore, not to be taken in a limiting sense, and the scope of the present disclosure is defined only by the appended claims and equivalents thereof.

Figure 2:
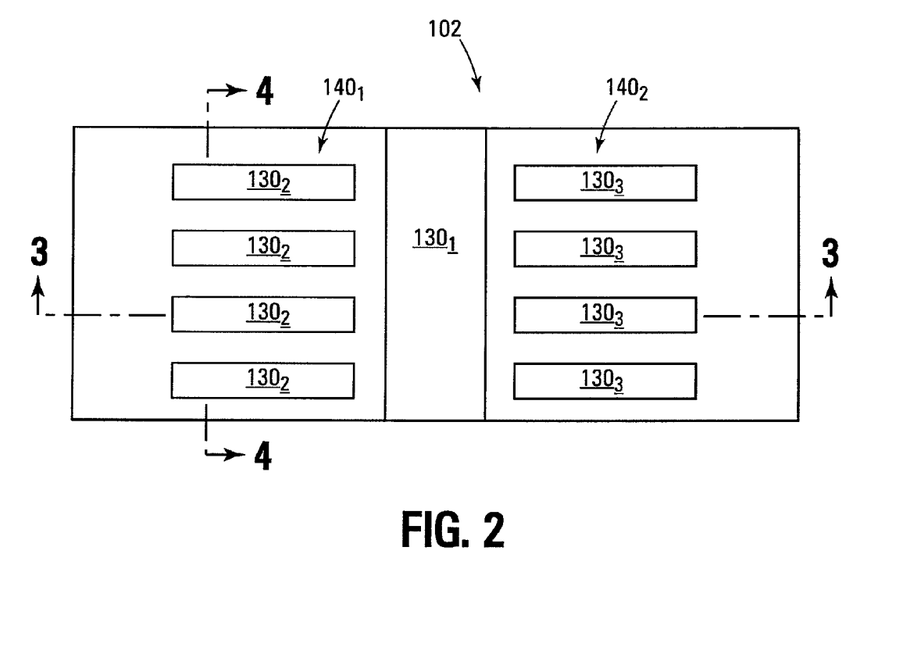
FIG. 2 is a top view of an embodiment of a transistor during a stage of fabrication, according to an embodiment.
Figure 3:
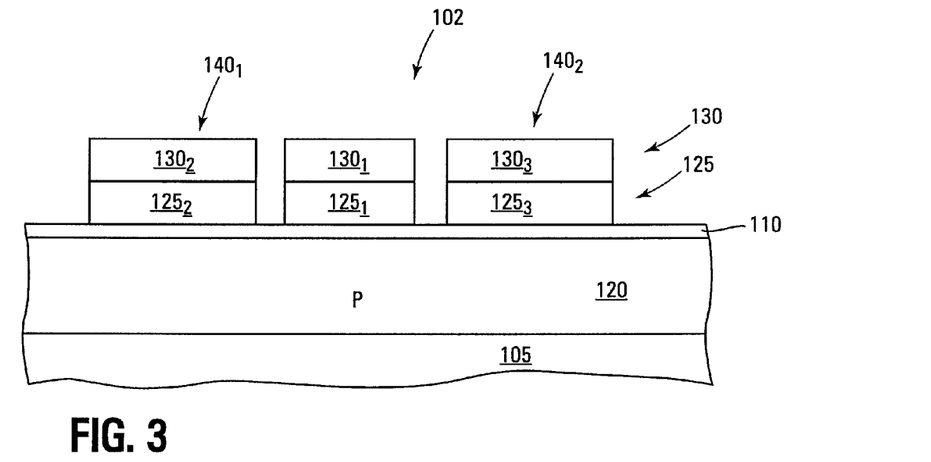
FIG. 3 is a cross-section view taken along line 3-3 of FIG. 2.
Figure 4:
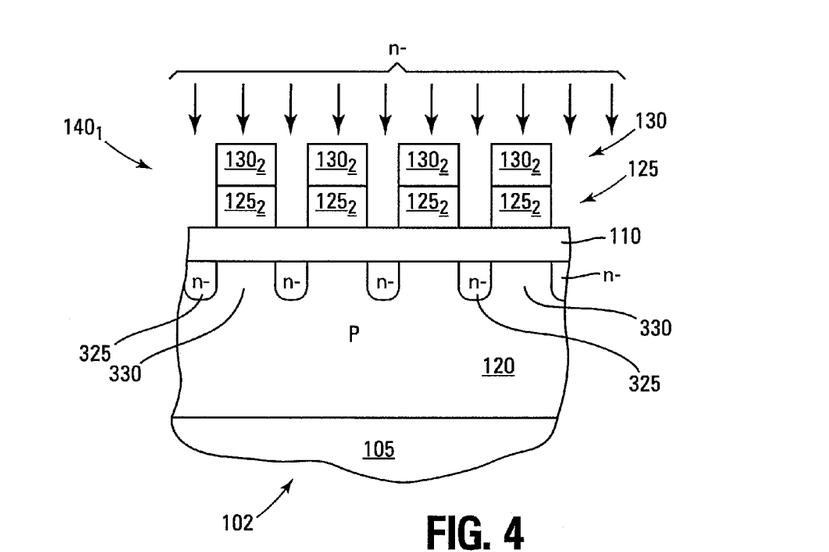
FIG. 4 is a cross-section view taken along line 4-4 of FIG. 2, illustrating doping of an extension region of the transistor of FIG. 2, according to another embodiment.

FIG. 2 is a top view of an electronic device, such as a transistor 102; FIG. 3 is a cross-section view taken along line 3-3 of FIG. 2; and FIG. 4 is a cross-section view taken along line 4-4 of FIG. 2. FIGS. 2-4 illustrate transistor 102 after several processing steps have occurred.

Transistor 102 may be a high-voltage transistor having a breakdown voltage above about 15 to about 80 volts or greater, e.g., about 20 to about 35 volts for some embodiments and about 30 volts for other embodiments. Note that the breakdown voltage may be defined as the voltage at which the drain (or source) breaks down while the transistor is turned off. Transistor 102 may be a field effect transistor (FET), such as a field effect transistor operating in a depletion mode. For example, a field effect transistor operating in a depletion mode may have a threshold voltage less than about 0V, e.g., typically about −5V to about −2V. For one embodiment, transistor 102 may be a Reduced Surface Field (RESURF) device. For other embodiments, transistor 102 may be an accumulation type transistor, e.g., with a threshold voltage within an operating range of about 0.3 V to about 1.5 V or an accumulation type transistor with a low threshold voltage, e.g., a threshold voltage less than about 0.3 V down to about 0V.

Transistor 102 may be used on the periphery of a memory device. For example, one or more transistors 100 may be located between charge pumps and the string drivers of a memory device and may be used in charge pump circuitry and as the string drivers. Note that string drivers are high-voltage devices that pass voltage to access lines (e.g., word lines) of a memory device. One or more transistors 100 may be used as high-voltage switches in one embodiment.

For one embodiment, transistor 102 may be formed by forming a gate dielectric 110, e.g., an oxide or other dielectric material, over a semiconductor 105, such as monocrystalline silicon or the like. A portion of semiconductor 105 may be doped to have a region 120 having a first conductivity type (e.g., a p-type conductivity region). As an example, the region 120 may be doped with a boron (B) or another p-type impurity. For example, region 120 having the first conductivity type may form a p-well within semiconductor 105.

A conductor 125 is formed over gate dielectric 110. For example, conductor 125 may comprise, consist of, or consist essentially of conductively doped polysilicon and/or may comprise, consist of, or consist essentially of metal, such as a refractory metal, or a metal-containing material, such as a refractory metal silicide layer, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

A mask 130 is formed over conductor 125 and is patterned for exposing portions of conductor 125 for removal. Patterned mask 130 includes mask portion $130_1$ and mask strips $130_2$ and $130_3$ on either side of mask portion $130_1$. As one example, mask 130 is a patterned photoresist as is commonly used in semiconductor fabrication.

The exposed portions of conductor 125 are then removed, such as by etching, stopping on or within gate dielectric 110, thereby exposing portions of gate dielectric 110. Removal of the exposed portions of conductor 125 forms a control gate $125_1$ and conductor strips $125_2$ and $125_3$, on either side of control gate $125_1$, from conductor 125. For example, strips of conductor 125 are removed to expose portions of gate dielectric 110.

Conductor strips $125_2$ and $125_3$ are formed concurrently (e.g., substantially concurrently) with control gate $125_1$, e.g., during the same processing step, and do not add any processing steps, other than the patterning for the conductor strips, to those that would otherwise occur when forming the control gate $125_1$ without conductor strips $125_2$ and $125_3$. That is, the patterning for conductor strips $125_2$ and $125_3$ occurs as part of the patterning for control gate $125_1$.

Conductor strips $125_2$ and mask strips $130_2$ are located in a source/drain extension region $140_1$, e.g., a drain extension region, of transistor 102, and conductor strips $125_3$ and mask strips $130_3$ are located in a source/drain extension region $140_2$, e.g., a source extension region, of transistor 102. As described below, each extension region will be interposed between control gate $125_1$ and a source/drain region of transistor 102. The conductor strips and the portions of conductor 125 within the extension regions that are removed respectively alternately block and expose gate dielectric 110, as shown in FIG. 4.

After removing the portions of conductor 125, extension regions $140_1$ and $140_2$ are conductively doped to have a second conductivity type different than the first conductivity type, e.g., an n-type conductivity. For example, the extension regions $140_1$ and $140_2$ can be conductively doped with impurities, such as n-type impurities. N-type impurities may comprise, consist of, or consist essentially of antimony (Sb), arsenic (As), phosphorus (P), etc. That is, extension regions $140_1$ and $140_2$ may be implanted to an n-type conductivity type.

During the implantation, as shown in FIG. 4 for extension region $140_1$, n-type impurities are prevented (e.g., substantially prevented) from being implanted into at least a portion of the portions of p-type region 120 that directly underlie conductor strips $125_2$ so that the regions between conductor strips $125_2$ receive the n-type impurities. That is, the conductor strips $125_2$ and the mask strips $130_2$ formed over conductor strips $125_2$ block the n-type impurities and prevent (e.g., substantially prevent) the n-type impurities from being implanted in at least a portion of the portions of p-type region 120 that directly underlie, e.g., that are vertically aligned with, conductor strips $125_2$. Similarly, for extension region $140_2$, the conductor strips $125_3$ and the mask strips $130_3$ formed over conductor strips $125_3$ block the n-type impurities and prevent (e.g., substantially prevent) the n-type impurities from being implanted in at least a portion of the portions of p-type region 120 that directly underlie, e.g., that are vertically aligned with, conductor strips $125_3$.

Figure 5:
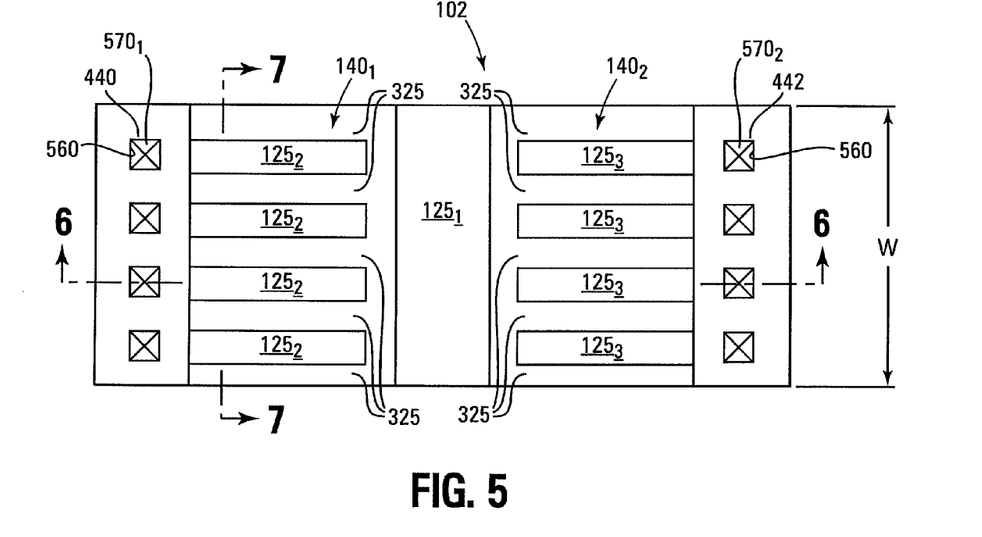
FIG. 5 is a top view of the transistor of FIG. 2 during another stage of fabrication, according to another embodiment.

The portions of p-type region 120 that are implanted with n-type impurities form $n^-$-type strips 325 in p-type region 120 within the respective extension regions, as shown in FIGS. 4 and 5. The $n^-$ denotes that strips 325 are lightly doped, e.g., to a dose level (an implant density) of about $2 \times 10^{12}/cm^2$ to about $5 \times 10^{12}/cm^2$ for some embodiments. The p-type regions under conductor strips $125_2$ and $125_3$ form p-type strips 330 within each extension region. For example, the p-type strips 330 and $n^-$-type strips 325 alternate within each of the extension regions, as shown in FIG. 4, producing a plurality of p-n junctions, i.e., junctions of differing conductivity types, within each of the extension regions. That is, there may be p-n junction at the sides and bottom of each of the $n^-$-type strips 325.

During the n-type impurity implantation, conductor strips $125_2$ and $125_3$ respectively cover portions of gate dielectric 110 and p-type region 120 corresponding p-type strips 330, as shown in FIG. 4. During the n-type impurity implantation, portions of transistor 102 other than the extension regions may be prevented from receiving the $n^-$-type impurities, e.g., by a suitable mask (not shown).

After the implantation, mask portion $130_1$ and mask strips $130_2$ and $130_3$ are removed, e.g., by etching, ashing or cleaning, exposing control gate $125_1$ and conductor strips $125_2$ and $125_3$. For one embodiment, conductor strips $125_2$ and $125_3$ may be optionally removed while control gate $125_1$ is protected, e.g., with a mask. For another embodiment, mask portion $130_1$ and mask strips $130_2$ and $130_3$ may be removed before the n-type impurity implantation.

Figure 6:
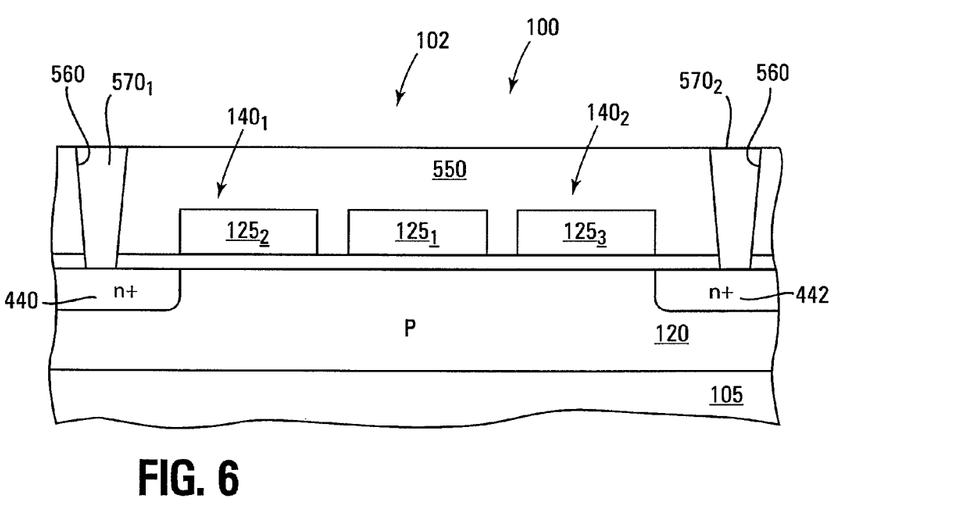
FIG. 6 is a cross-section view taken along line 6-6 of FIG. 5.

Source/drain regions 440 and 442 are formed in p-type region 120, e.g., after the removal of mask portion $130_1$ and mask strips $130_2$ and $130_3$, as shown in FIGS. 5 and 6. For example, source/drain regions 440 and 442 may be formed by doping to create $n^+$-regions. The $n^+$ denotes that source/drain regions 440 and 442 are doped with a higher dose level than strips 325, e.g., source/drain regions 440 and 442 may receive a dose level that is about three orders of magnitude greater than that received by strips 325 for some embodiments. For example, source/drain regions 440 and 442 may receive a dose level (an implant density) of about $1 \times 10^{15}/cm^2$. For some embodiments, source/drain regions 440 and 442 may extend an entire width of transistor 102, as shown in FIG. 4. During the formation of source/drain regions 440 and 442, the extension regions may be protected, e.g., using a mask. For other embodiments, source/drain regions 440 and 442 may be doped with a different impurity than strips 325. For example, source/drain regions 440 and 442 may be doped with one of antimony (Sb), arsenic (As), or phosphorus (P), and strips 325 may be doped with an other of antimony (Sb), arsenic (As), or phosphorus (P).

Figure 7:
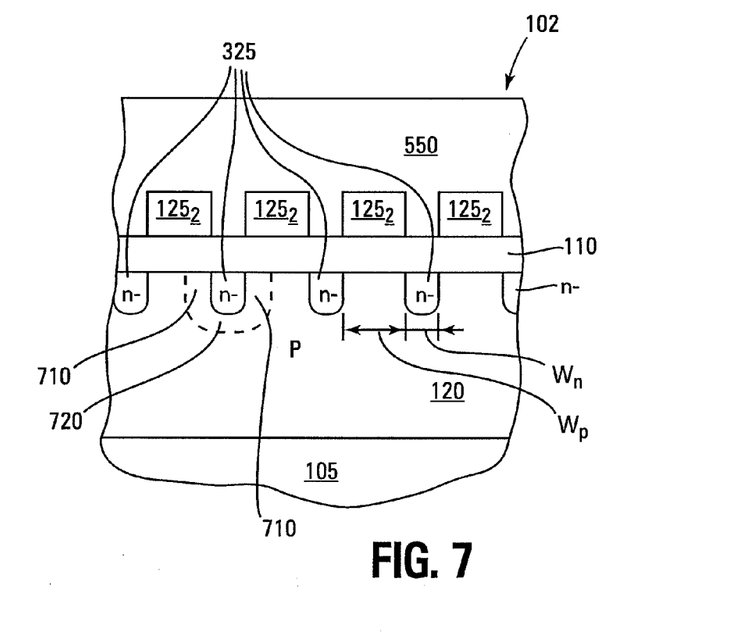
FIG. 7 is a cross-section view taken along line 7-7 of FIG. 5.

A dielectric 550, e.g., bulk dielectric material, may then formed over the source/drain regions 440 and 442, control gate $125_1$, and extension regions $140_1$ and $140_2$, as shown in FIGS. 6 and 7. Note that FIG. 6 is a cross-section view taken along line 6-6 of FIG. 5, and FIG. 7 is a cross-section view taken along line 7-7 of FIG. 5, where dielectric 550 is omitted in FIG. 5 for purposes of clarity. One example for dielectric 550 would be a doped silicate glass. Examples of doped silicate glasses include BSG (borosilicate glass), PSG (phosphosilicate glass), and BPSG (borophosphosilicate glass). Another example for dielectric 550 would be TEOS (tetraethylorthosilicate).

A mask (not shown) may be formed over dielectric 550 and patterned to expose portions of dielectric 550 directly over (e.g., vertically aligned with) source/drain regions 440 and 442 for removal. The exposed portions of dielectric 550 directly over source/drain regions 440 and 442 are removed, such as by etching, stopping on or within source/drain regions 440 and 442 to form contact openings, such as contact holes 560, as shown in FIGS. 5 and 6. The mask is removed, and contacts 570 are formed in contact holes 560, e.g., in direct physical contact with source/drain regions 440 and 442, from a conductor. For example, contacts $570_1$ may be drain contacts and contacts $570_2$ source contacts.

Alternatively, instead of forming contacts $570_1$ and $570_2$ in contact holes 560, a contact $570_1$ and a contact $570_2$ may be respectively formed in contact slots formed in dielectric 550 and, e.g., respectively substantially spanning the width W of the source/drain regions 440 and 442, and thus of transistor 102.

The conductor of contacts 570 may, for example, comprise, consist of, or consist essentially of a metal or metal-containing layer and may be aluminum, copper, a refractory metal, or a refractory metal silicide layer. Alternatively, the conductor may contain multiple metal-containing layers, e.g., a titanium nitride (TiN) barrier layer formed over (e.g., in direct physical contact with) source/drain regions 440 and 442, a titanium (Ti) adhesion layer formed over the barrier layer, and a tungsten (W) layer formed over the adhesion layer.

Alternatively, dielectric 550 may be formed before the formation of source/drain regions 440 and 442. The contact slots are then formed in dielectric 550, exposing portions of p-type region 120. Then, the exposed portions p-type region 120 are doped through the contact slots to form a n+-type source/drain region within p-type region 120 at the bottom of each contact slot.

Figure 8:
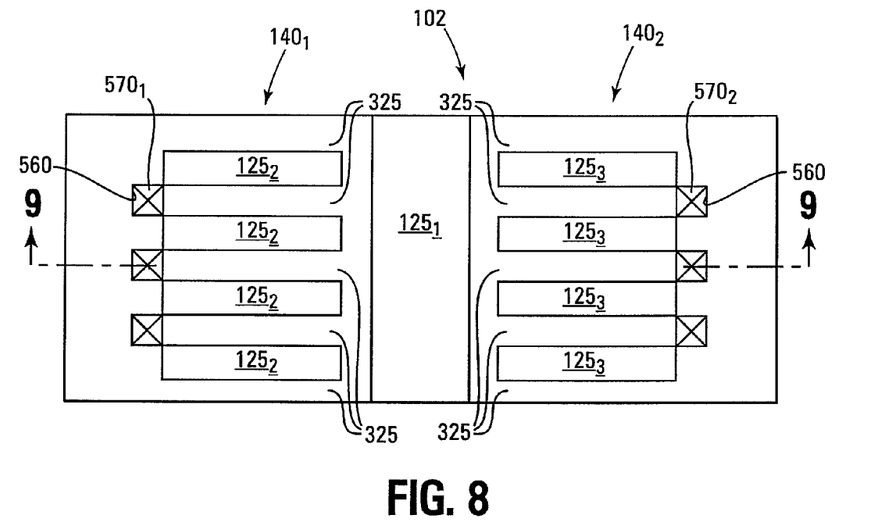
FIG. 8 is a top view of the transistor of FIG. 2 during another stage of fabrication, according to another embodiment.
Figure 9:
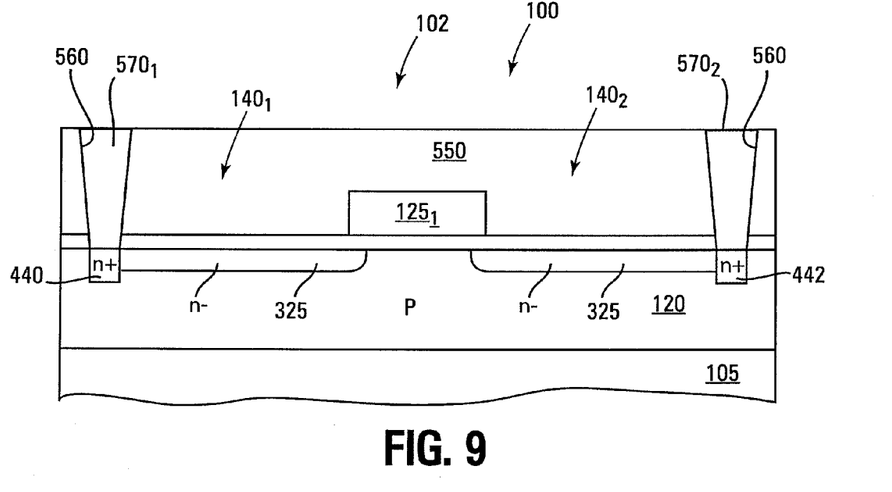
FIG. 9 is a cross-section view taken along line 9-9 of FIG. 8.

For another embodiment, the contact holes 560 are formed in dielectric 550 exposing portions of p-type region 120. Then, the exposed portions p-type region 120 are doped through the contact holes 560 to form an n+-type source/drain region within p-type region 120 at the bottom of each contact hole 560, as shown in FIGS. 8 and 9. A benefit of this is that the n+-type implant is self-aligned to the contact opening, allowing for a slightly smaller contact-to-gate design rule. Note that FIG. 9 is a cross-section view taken along line 9-9 of FIG. 8, where dielectric 550 is omitted from FIG. 8 for purposes of clarity.

The contacts 570 are subsequently formed in contact holes 560, as described above. This results in a plurality of separated source/drain regions 440 and separated source/drain regions 442 respectively localized under (e.g., in direct physical contact with) contacts $570_1$ and contacts $570_2$. For example, contacts $570_1$ in FIG. 8 respectively correspond to individual, separated source/drain regions 440 on a one-to-one basis, and contacts $570_2$ respectively correspond to individual, separated source/drain regions 442 on a one-to-one basis. Note that source/drain regions 440 may be formed at the ends of $n^-$-type strips 325 within extension region $140_1$, and source/drain regions 442 may be formed at the ends of $n^-$-type strips 325 within extension region $140_2$, as shown in FIG. 9.

For one embodiment, transistor 102 may only have one extension region, such as extension region $140_1$. For another embodiment, there may be different number of $n^-$-type strips 325 in extension region $140_1$ than in extension region $140_2$.

The presence of the alternating $n^-$-type strips 325 and p-type strips 330 in at least one of the extension regions acts to shift the breakdown-voltage versus drain-extension-region-doping-level curve (e.g., doping curve) of transistor 102 to higher doping levels. That is, a given breakdown voltage occurs at a higher doping level when alternating $n^-$-type strips 325 and p-type strips 330 are present in at least one of the extension regions, as opposed to when an $n^-$-type extension region is over the p-type region 120 with no alternating $n^-$-type strips 325 and p-type strips 330 as is typical in conventional RESURF transistors. This is because during bias conditions, lateral electric fields 710 develop in the p-type strips 330 between successive $n^-$-type strips 325, owing to the p-n junctions at the sides $n^-$-type strips 325 (FIG. 7), in addition to the vertical electric fields 720 in the p-type region 120, owing to the p-n junctions the bottoms of $n^-$-type strips 325.

The lateral electric fields 710 act to enhance the depletion in the extension regions over that when an $n^-$-type extension region is over the p-type region 120 with no alternating $n^-$-type strips 325 and p-type strips 330. In this case, only vertical electric fields 720 occur in the in the p-type region 120, owing to the p-n junction at the bottom of the $n^-$-type extension region. Therefore, a higher doping level is utilized to produce a given breakdown voltage. For example, the doping curve of transistor 102 may shift from having doping curve 100 in FIG. 1 to having the doping curve doping curve 100' due to the presence of the alternating $n^-$-type strips 325 and p-type strips 330 in at least one of the extension regions.

The amount by which the doping curve shifts is generally sensitive to the ratio of the width $W_p$ of the p-type strips 330 to the width $W_n$ of the $n^-$-type strips 325 (FIG. 7). For example, the amount by which the doping curve shifts may increase as the ratio ($W_p/W_n$) of the width of the p-type strips 330 to the width of the d-type strips 325 increases. For one embodiment, the ratio $W_p/W_n$ in each of the extension regions is about 1:1 or less. The ratio $W_p/W_n$ in each of the extension regions may be greater than about 1:1, however.

Note that adjusting the ratio $W_p/W_n$ and/or the number of $n^-$-type strips 325 in at least one extension region enables the doping curve to be adjusted, e.g., the doping level at which the peak breakdown voltage occurs to be adjusted. For example, adjusting the ratio $W_p/W_n$ and/or the number of $n^-$-type strips 325 in a plurality of transistors, e.g., on a periphery of a memory device, can adjust the doping curves of these transistors so that the doping levels at which their respective peaks occur substantially coincide or are at least closer to each other. As such, a single doping level can be used produce the peak (or near peak) bias voltage in the plurality of transistors that might otherwise have different peak doping levels.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A method of forming a transistor, comprising:
    forming a gate dielectric over a semiconductor having a first conductivity type;
    forming a control gate over the gate dielectric;
    forming first and second source/drain regions having a second conductivity type different than the first conductivity type in the semiconductor having the first conductivity type; and
    forming strips having the second conductivity type within the semiconductor having the first conductivity type interposed between the control gate and at least one of the first and second source/drain regions;
    wherein the strips having the second conductivity type that are interposed between the control gate and the at least one of the first and second source/drain regions, and portions of the semiconductor having the first conductivity type that are interposed between the control gate and the at least one of the first and second source/drain regions, alternate.

2. The method of claim 1, further comprising forming the control gate before forming the strips having the second conductivity type, wherein forming control gate further comprises forming a plurality of conductor strips over the gate dielectric, the conductor strips respectively covering the portions of the semiconductor having the first conductivity type that are interposed between the control gate and the at least one of the first and second source/drain regions.

3. The method of claim 2, wherein the control gate and the plurality of conductor strips are formed from the same conductive material during the same process step.

4. The method of claim 2, wherein the first conductivity type is p-type and the second conductivity type is n-type, and wherein forming the strips in the semiconductor having the second conductivity type comprises doping portions of the semiconductor that are not covered by the conductor strips with n-type impurities and using the conductor strips to prevent at least a portion of the portions of the semiconductor having the first conductivity type covered thereby from receiving the n-type impurities.

5. The method of claim 4, wherein the first and second source/drain regions receive a higher dose level of n-type impurities than the strips that receive the n-type impurities.

6. The method of claim 5, wherein the source/drain regions receive a dose level of about $1 \times 10^{15}/cm^2$ of the n-type impurities and the strips that receive the n-type impurities receive a dose level of about $2 \times 10^{12}/cm^2$ to about $5 \times 10^{12}/cm^2$ of the n-type impurities.

7. The method of claim 2, wherein the plurality of conductor strips are part of the transistor.

8. The method of claim 2, further comprising removing the conductor strips after forming the strips having the second conductivity type.

9. The method of claim 1, wherein forming strips having the second conductivity type within the semiconductor having the first conductivity type interposed between the control gate and at least one of the first and second source/drain regions comprises forming strips having the second conductivity type interposed between the control gate and both of the first and second source/drain regions.

10. The method of claim 9, wherein a number of strips having the second conductivity type interposed between the control gate and one of the first and second source/drain regions is the same as a number of strips having the second conductivity type interposed between the control gate and an other one of the first and second source/drain regions.

11. The method of claim 1, wherein a ratio of a width of each of the strips having the second conductivity type to the width of each of the portions of the semiconductor having the first conductivity type is about 1:1.

12. The method of claim 1, wherein the at least one of the first and second source/drain regions is a drain region and the other one of the first and second source/drain regions is a source region.

13. The method of claim 1, further comprising forming an other dielectric over the control gate and the strips having the second conductivity type within the semiconductor having the first conductivity type, wherein the first and second source/drain regions are formed after forming the other dielectric.

14. The method of claim 13, wherein forming the first and second source/drain regions after forming the other dielectric comprises:
    forming openings in the other dielectric to expose portions of the semiconductor; and
    doping the exposed portions of the semiconductor through the openings in the other dielectric to form the first and second source/drain regions.

15. The method of claim 14, wherein the openings are either slots or holes.

16. The method of claim 1, wherein forming the first and second source/drain regions comprises respectively forming the first and second source/drain regions on different sides of the control gate, wherein the strips having the second conductivity type that are interposed between the control gate and the at least one of the first and second source/drain regions are formed on the same side of the control gate as the at least one of the first and second source/drain regions, and wherein the portions of the semiconductor having the first conductivity type that are interposed between the control gate and the at least one of the first and second source/drain regions are on the same side of the control gate as the at least one of the first and second source/drain regions.

17. A method of forming a transistor, comprising:
    forming a gate dielectric over a semiconductor having a first conductivity type;
    forming a conductor over the gate dielectric;
    removing portions of the conductor to expose portions of the gate dielectric within an extension region of the transistor and to form a control gate of the transistor from the conductor and a plurality of conductor strips of the transistor from the conductor that cover other portions of the gate dielectric within the extension region; and
    implanting impurities of a second conductivity type into portions of the semiconductor having the first conductivity type directly under the exposed portions of the gate dielectric within the extension region while using the plurality of conductor strips to prevent the impurities from being implanted in portions of the semiconductor within the extension region having the first conductivity type covered by the plurality of conductor strips.

18. The method of claim 17, further comprising implanting impurities of the second conductivity type into the semiconductor having the first conductivity type on either side of the control gate to form a source region and a drain region within the semiconductor having the first conductivity type on either side of the control gate so that the extension region is interposed between the control gate and the source region and/or the drain region.

19. The method of claim 18, wherein the source region and drain region receive impurities of the second impurity type that are different than the impurities of the second conductivity type that are implanted into portions of the semiconductor having the first conductivity type within the extension region and/or wherein the source and drain regions receive a higher dose level of impurities than the portions of the semiconductor having the first conductivity type within the extension region.

20. The method of claim 17, wherein the first conductivity type is p-type, the second conductivity type is n-type, and the conductor is polysilicon.

21. A method of forming a transistor, comprising:
forming a gate dielectric over a semiconductor having a first conductivity type;
forming a conductor over the gate dielectric;
removing portions of the conductor to expose portions of the gate dielectric within an extension region and to form a control gate from the conductor and a plurality of conductor strips from the conductor that cover other portions of the gate dielectric within the extension region;
implanting impurities of a second conductivity type into portions of the semiconductor having the first conductivity type directly under the exposed portions of the gate dielectric within the extension region while using the plurality of conductor strips to prevent the impurities from being implanted in portions of the semiconductor having the first conductivity type covered by the plurality of conductor strips; and
removing the plurality of conductor strips after implanting the impurities of the second conductivity type.

22. A method of forming a transistor, comprising:
forming a gate dielectric over a semiconductor having a first conductivity type;
forming a conductor over the gate dielectric,
removing portions of the conductor to expose portions of the gate dielectric within an extension region and to form a control gate from the conductor and a plurality of conductor strips from the conductor that cover other portions of the gate dielectric within the extension region;
implanting impurities of a second conductivity type into portions of the semiconductor having the first conductivity type directly under the exposed portions of the gate dielectric within the extension region while using the plurality of conductor strips to prevent the impurities from being implanted in portions of the semiconductor having the first conductivity type covered by the plurality of conductor strips;
forming first and second source/drain regions having the second conductivity type in the semiconductor having the first conductivity type;
wherein the extension region comprises a portion between the control gate and the first source/drain; and
wherein the portions of the semiconductor directly under the exposed portions of the gate dielectric that are implanted with the impurities of the second conductivity type and the portions of the semiconductor having the first conductivity type covered by the plurality of conductor strips alternate within the portion of the extension region between the control gate and the first source/drain.

23. The method of claim 22, wherein the extension region comprises an other portion between the control gate and the second source/drain, and wherein the portions of the semiconductor directly under the exposed portions of the gate dielectric that are implanted with the impurities of the second conductivity type and the portions of the semiconductor having the first conductivity type covered by the plurality of conductor strips alternate within the other portion of the extension region between the control gate and the second source/drain.

* * * * *

UNITED STATES PATENT AND TRADEMARK OFFICE
CERTIFICATE OF CORRECTION

| | | |
|---|---|---|
| PATENT NO. | : 8,815,667 B2 | Page 1 of 1 |
| APPLICATION NO. | : 12/639158 | |
| DATED | : August 26, 2014 | |
| INVENTOR(S) | : Smith et al. | |

It is certified that error appears in the above-identified patent and that said Letters Patent is hereby corrected as shown below:

In the Claims

Column 9, line 41, Claim 22, delete "dielectric," and insert -- dielectric; --, therefor.

Signed and Sealed this
Twenty-eighth Day of October, 2014

Michelle K. Lee
*Deputy Director of the United States Patent and Trademark Office*